United States Patent

Izumi et al.

[11] Patent Number: 5,916,009
[45] Date of Patent: Jun. 29, 1999

[54] APPARATUS FOR APPLYING AN URGING FORCE TO A WAFER

[75] Inventors: Shigeto Izumi; Hatsuyuki Arai, both of Ayase, Japan

[73] Assignee: Speedfam Co., Ltd., Japan

[21] Appl. No.: 08/921,748

[22] Filed: Aug. 27, 1997

[30] Foreign Application Priority Data

Aug. 27, 1996 [JP] Japan .................................. 8-244061

[51] Int. Cl.⁶ ...................................................... B24B 49/00
[52] U.S. Cl. .................................... 451/5; 451/8; 451/24; 451/288; 451/398
[58] Field of Search ................................. 279/3; 269/21; 451/5, 8, 9, 10, 11, 41, 24, 288, 290, 385, 398

[56] References Cited

U.S. PATENT DOCUMENTS

| | | |
|---|---|---|
| 5,498,199 | 3/1996 | Karlsrud et al. . |
| 5,653,622 | 8/1997 | Drill et al. .............................. 451/21 X |
| 5,738,568 | 4/1998 | Jurjevic et al. ....................... 451/288 X |
| 5,795,215 | 8/1998 | Guthrie et al. ......................... 451/41 X |

FOREIGN PATENT DOCUMENTS 60-29416  9/1985  Japan .

*Primary Examiner*—Timothy V. Eley
*Attorney, Agent, or Firm*—Snell & Wilmer

[57] ABSTRACT

A wafer pressurizing apparatus capable of improving the polishing accuracy of a wafer while excluding influences on a pressure sensor of a rotational force and a horizontal force created during a wafer polishing operation. The apparatus includes a carrier (1) adapted to rotate about its own axis of rotation while maintaining a surface of the wafer (200) in contact with a surface plate (210), a cylinder (300) for urging the carrier (1) against the surface plate (210), a pressure sensor in the form of a load cell (LS) for sensing an urging force applied to the wafer (200) and generating a corresponding output signal (V), and a controller (6) for controlling the urging force of the cylinder based on the output signal (V) from the load cell (LS). The carrier (1) comprises a holder (2) for holding the wafer (200), a pressure receiving member (3) disposed in confrontation with the holder (2) for receiving the urging force of the cylinder (300), and two annular flat spring members (4a, 4b) disposed between the pressure-receiving member (3) and the holder (2) so as to be deformable only in a direction perpendicular to the surface of the wafer (200). The load cell (LS) is disposed between the pressure-receiving member (3) and the holder (2).

17 Claims, 8 Drawing Sheets

(PRIOR ART)

APPARATUS FOR APPLYING AN URGING FORCE TO A WAFER

BACKGROUND OF THE INVENTION

1. Field of the Invention

The present invention relates to a wafer pressurizing apparatus for applying an urging force to a wafer, and more particularly to such an apparatus suitable for use with a wafer polishing apparatus such as a chemical mechanical polishing (CMP) apparatus.

2. Description of the Related Art

In the past, a CMP apparatus has hitherto been known as this kind of wafer pressurizing apparatus. The CMP apparatus is generally constructed such that a wafer on a surface plate is carried by a carrier which is supported by a carrier shaft operatively connected with an upper cylinder. The carrier shaft is urged downwardly by means of the upper cylinder so as to push down the carrier whereby the wafer carried by the carrier is urged against a surface of the surface plate while the carrier is driven to rotate on its own axis of rotation and at the same time the surface plate is being rotated by a drive means such as an electric motor.

In a wafer polishing process using such a CMP apparatus, the magnitude of a polishing or urging force to be applied to the wafer during the polishing operation is very important from the point of view of polishing accuracy. That is, the polishing accuracy largely depends upon the polishing or urging force on the wafer.

Thus, a CMP apparatus has been proposed which is capable of maintaining the polishing force at a desired value by use of a pressure sensor such as a load cell.

FIG. 13 schematically illustrates a typical example of such a CMP apparatus. As clearly seen from this figure, this apparatus is equipped with a load cell LS which is disposed between a carrier shaft 110 mounted on a carrier 100 supporting a wafer 200 on a surface plate 210 and a piston rod 310 of a cylinder 300 which is adapted to push down the carrier shaft 110.

With this arrangement, the load cell LS senses the pressure or urging force of the cylinder 300 which is assumed as a polishing force actually applied to the wafer 200.

When the sensed pressure or force is different from a predetermined pressure value, the urging force of the cylinder is adjusted so as to maintain the sensed pressure at the predetermined pressure value.

In fact, however, the weights of the carrier shaft 110 and the carrier 100 in addition to the urging force of the cylinder 300 are applied to the wafer 200 as a wafer urging force. As a result, the sensed pressure value of the load cell LS generally differs from the actual polishing force.

Accordingly, the above-mentioned conventional CMP apparatus involves relatively large errors in controlling the polishing force applied to the wafer 200, thus impairing the polishing accuracy.

In view of the above, another type of CMP apparatus has been proposed which has a load cell LS provided within a carrier.

FIG. 14 is a cross-sectional view schematically illustrating essential portions of this CMP apparatus. In this apparatus, the carrier 100 includes a housing 101 supporting a wafer 200, and a flange 102 mounted on the housing 102 for movement in a vertical direction, with the load cell LS being disposed at a location between the housing 101 and the flange 102.

With the CMP apparatus as constructed above, the pressure or urging force due to the weights of the carrier shaft 110 and the carrier 100 in addition to the pressure force of the cylinder 300 can be sensed by the load cell LS, so that the pressure value thus sensed by the load cell LS becomes substantially equal to the actual polishing force applied to the wafer 200.

The CMP apparatus shown in FIG. 14, however, involves the following problems.

The carrier 100 is driven to rotate about its carrier shaft 110 while urging the wafer 200 against the rotating surface plate 210, so that in addition to a vertical force V, a rotational force R due to the self rotation of the carrier 100 and a horizontal force H due to the rotating surface plate 210 are applied to the load cell LS.

Consequently, the load cell LS senses the rotational force R and the horizontal force H in addition to the vertical force V which is to be sensed as the polishing force applied to the wafer 200, thus giving rise to potential errors in the control of the polishing force.

Moreover, application of the rotational force R and the horizontal force H to the load cell LS might damage the load cell LS.

SUMMARY OF THE INVENTION

In view of the above, the present invention is intended to solve the above-mentioned problems encountered with the conventional apparatuses, and has for its object to provide a novel and improved wafer pressurizing apparatus of the character described above which is capable of improving the polishing accuracy of a wafer while excluding influences on a pressure sensor of a rotational force and a horizontal force created during the wafer polishing operation.

In order to achieve the above object, according to the present invention, there is provided an apparatus for applying an urging force to a wafer, the apparatus comprising: a carrier adapted to rotate about its own axis of rotation while maintaining a surface of the wafer in contact with a surface plate; pressure-applying means for urging the carrier against the surface plate; pressure sensing means for sensing an urging force applied to the wafer and generating a corresponding output signal; and a controller for controlling the urging force of the pressure-applying means based on the output signal from the pressure sensing means. The carrier comprises: a holder for holding the wafer; a pressure receiving member disposed in confrontation with the holder for receiving the urging force of the pressure-applying means; and resilient means disposed between the pressure-receiving member and the holder so as to be deformable only in a direction perpendicular to the surface of the wafer. The pressure sensing means is disposed between the pressure-receiving member and the holder.

With this arrangement, when the carrier rotates about its own axis of rotation while making the wafer in contact with the surface plate, it is urged toward the surface plate by the pressure-applying means. The pressure sensing means senses the pressure or urging force applied to the wafer and generates a corresponding output signal, based on which the controller controls the urging force to the pressure-applying means. That is, the urging force of the pressure-applying means is transmitted through the pressure-receiving member of the carrier to the pressure sensing means, and thence to the wafer held by the holder, whereupon the holder and the pressure-receiving member might be subjected to a rotational force created upon self-rotation of the carrier and/or a horizontal force created by the surface plate, so that they could be forced to move in directions other than a direction perpendicular to the surface of the wafer, with the result that these forces might be applied to the pressure sensing means disposed between the pressure-receiving member and the holder.

In such a case, however, the resilient means, which is disposed between and mounted to the pressure-receiving member and the holder so as to be deformable only in the direction perpendicular to the surface of the wafer, serves to allow the holder and the pressure-receiving member to move only in the vertical direction with respect to the wafer, as a consequence of which the pressure sensing means would be subjected to the vertical force alone. Thus, the pressure sensing means can exclusively sense the urging force applied to the wafer in the vertical direction thereof, so that the controller can perform error-free control on the pressure-applying means, thereby enhancing the accuracy in polishing of the wafer to a substantial extent.

In a preferred form of the invention, the pressure-receiving member has a first support portion projecting toward the holder; and the holder has a second support portion projecting toward the pressure-receiving member; and the resilient means comprises a flat spring supported by the first and second support portions in such a manner that it is disposed in a parallel relation with respect to the surface of the wafer.

With the above arrangement, the flat spring supported by the first and second support portions of the pressure-receiving member and the holder in parallel with the wafer can deflect in a direction perpendicular to the surface of the wafer. With such a simple construction of the resilient means comprising the inexpensive flat spring, the entire apparatus can be manufactured at low cost.

In another preferred form of the invention, the flat spring comprises a plurality of flat spring members laminated one over another and supported by the first and second support portions.

With the above arrangement, the laminated structure of the plurality of flat spring members serves to increase their total strength against the urging force acting in a direction perpendicular to the surface of the wafer, thus resulting in an improvement in durability of the apparatus.

In a further preferred form of the invention, the flat spring comprises a plurality of flat spring members supported by the first and second support portions and disposed in parallel with respect to each other at a predetermined distance between the adjacent ones thereof.

With this arrangement, when the first or second support portion is caused to incline, bending moments created on the plurality of flat spring members act in opposing directions with respect to each other to thereby prevent inclination of these support portions. This serves to allow a uniform and stable pressure or urging force to be applied to the wafer.

In a yet further preferred form of the invention, the resilient means is mounted between the pressure-receiving member and the holder in such a manner that it is deformed by a predetermined amount in a direction toward the wafer.

With such an arrangement of the resilient means, the urging force to the wafer can be set to zero so that the pressure sensing means can sense a negative urging force or tensile force applied to the wafer. This allows the single pressure sensing means to have a dual function of acting not only as a compressive type sensor but also as a tensile type sensor.

The above and other objects, features and advantages of the present invention will more readily apparent from the following detailed description of preferred embodiments of the invention when taken in conjunction with the accompanying drawings.

BRIEF DESCRIPTION OF THE DRAWINGS

FIGS. 10(a) and 10(b) are schematic illustrations for explaining a torsion or twist of the annular flat spring, wherein FIG. 10(a) shows a torsional or twisted state of the annular flat spring as stacked, and FIG. 10(b) shows a torsion-preventing state according to the second embodiment;

DESCRIPTION OF PREFERRED EMBODIMENTS

Now, preferred embodiments of the present invention will be described in detail while referring to the accompanying drawings.

FIRST EMBODIMENT

Figure 1:
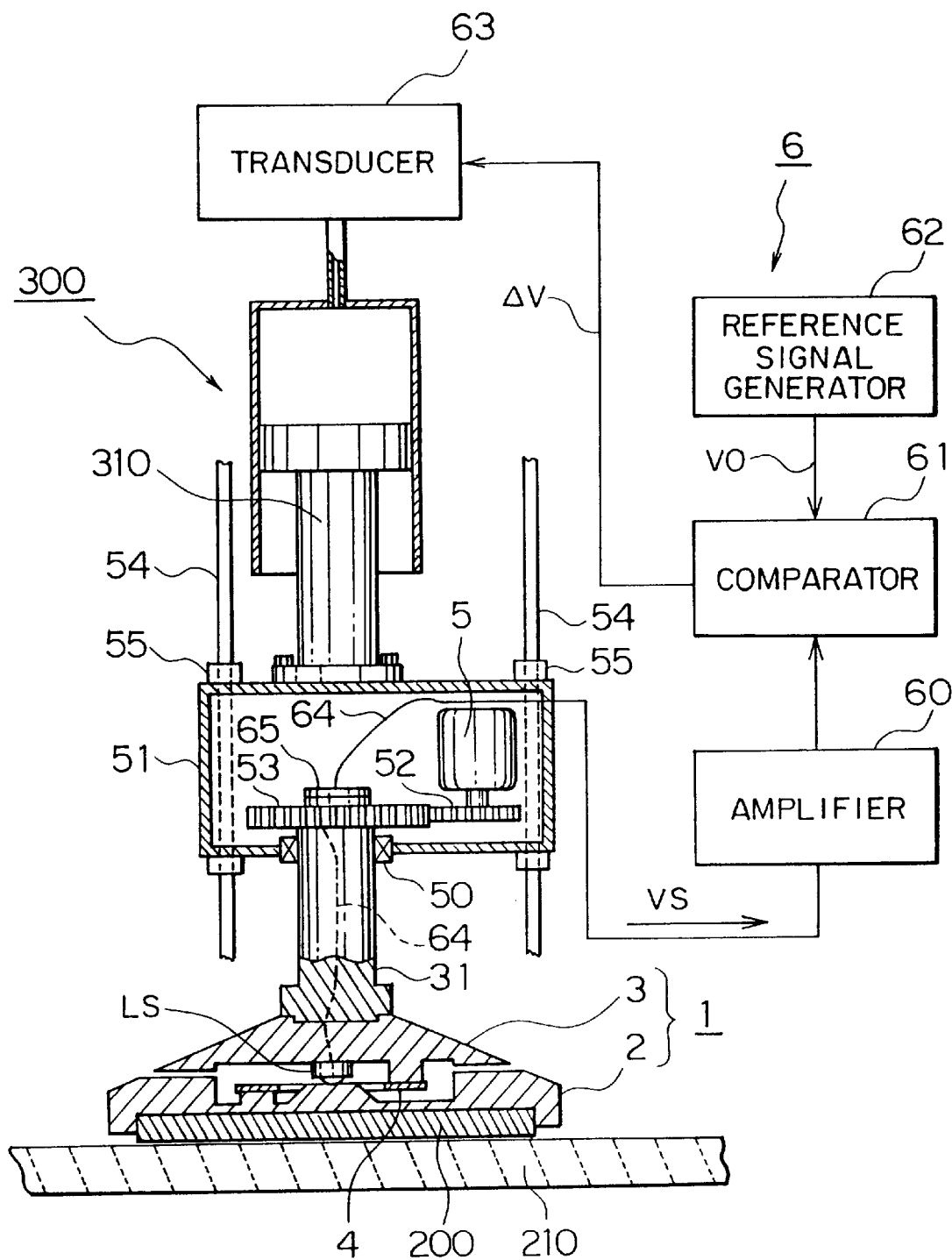
FIG. 1 is a schematic view showing the construction of a wafer pressurizing apparatus in accordance with a first embodiment of the present invention.
Figure 13:
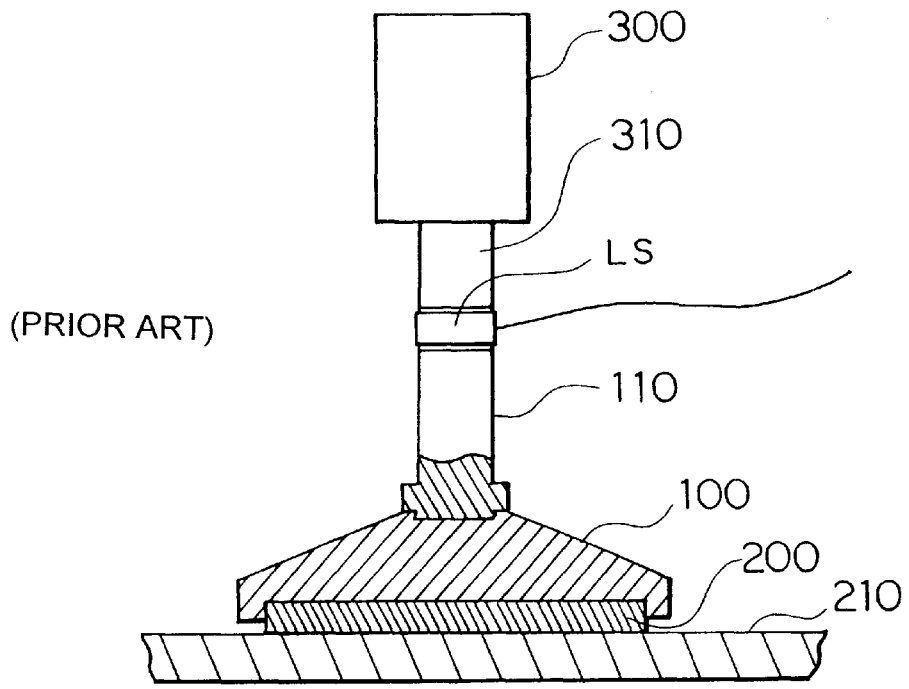
FIG. 13 is a conventional CMP apparatus.
Figure 14:
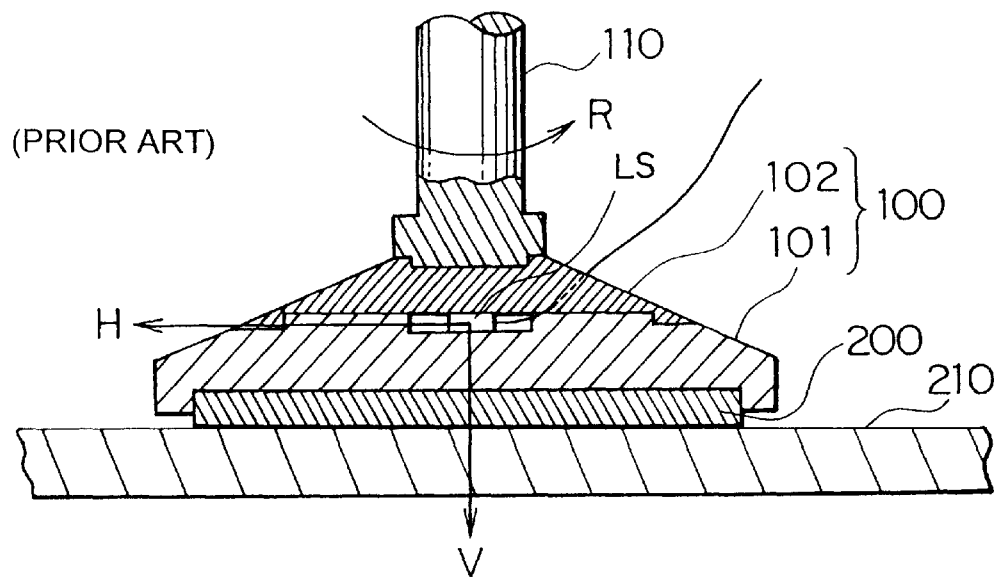
FIG. 14 is a schematic cross-sectional view showing another conventional CMP apparatus.

FIG. 1 schematically illustrates the construction of a wafer pressurizing apparatus constructed in accordance with a first embodiment of the present invention. In the following, those which are same as or corresponding to the members shown in FIGS. 13 and 14 are designated at the same symbols.

This embodiment shows a case in which a wafer pressurizing apparatus is applied to a CMP apparatus. As shown in FIG. 1, the CMP apparatus of this embodiment comprises a carrier 1 being rotatable on its own axis of rotation while making a wafer 200 in contact with a surface plate 210, a pressure-applying means in the form of a cylinder 300 for urging the carrier 1 against the surface plate 210, and a pressure control means in the form of a controller 6 including a pressure sensing means in the form of a load cell LS for sensing a pressure or urging force applied to the wafer 200 and generating a corresponding pressure signal VS representative of the sensed pressure value, the controller 6 serving to control a pressure or urging force of the cylinder 300 based on the pressure signal VS.

First, the carrier 1 constituting an essential portion of the apparatus will be described below in detail with particular reference to FIG. 2 which illustrates the carrier 1 in cross-sectional form.

Figure 2:
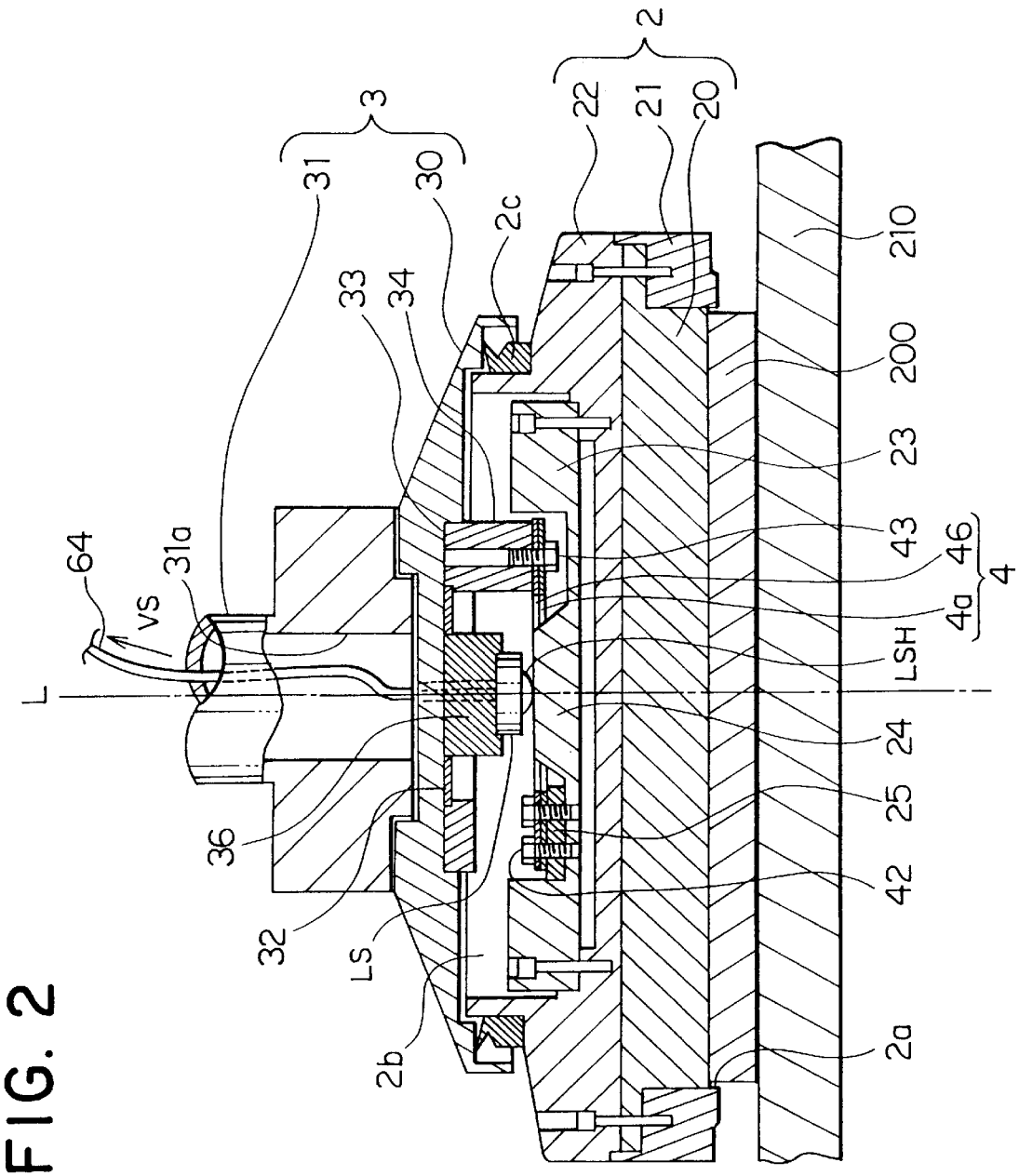
FIG. 2 is a cross sectional view of a carrier of FIG. 1.

As clearly shown in FIG. 2, the carrier 1 comprises a holder 2 for holding the wafer 200, a pressure-receiving member 3 attached to an upper portion of the holder 2 for receiving an urging force from the cylinder 300, and a resilient means in the form of an annular spring 4 mounted to the holder 2 and the pressure-receiving member 3 in a stacked manner.

The holder 2 is provided at its lower portion with a pressure plate 20 for urging the wafer 200, with an extension ring 21 being fitted on an outer peripheral surface of the pressure plate 20 so as to slightly project in a downward direction, with this arrangement, a space 2a is defined in a lower portion of the pressure plate 20 for receiving the wafer 200. on the pressure plate 20, there is disposed a housing 22 having a spring receiving chamber 2b for receiving therein the annular flat spring 4. The housing 22, the pressure plate 20 and the extension ring 21 are integrally connected with each other by means of bolts.

The pressure-receiving member 3 is covered on the top of the ho using 22. Specifically, the pressure-receiving member 3 has a flange 30 and a carrier shaft 31, the flange 30 being covered via a water-sealing V-shaped ring 2c on the top of the housing 22 so as to enclose the spring receiving chamber 2b with the carrier shaft 31 being vertically fitted in and fixedly secured to a central portion of an upper surface of the flange 30.

Figure 3:
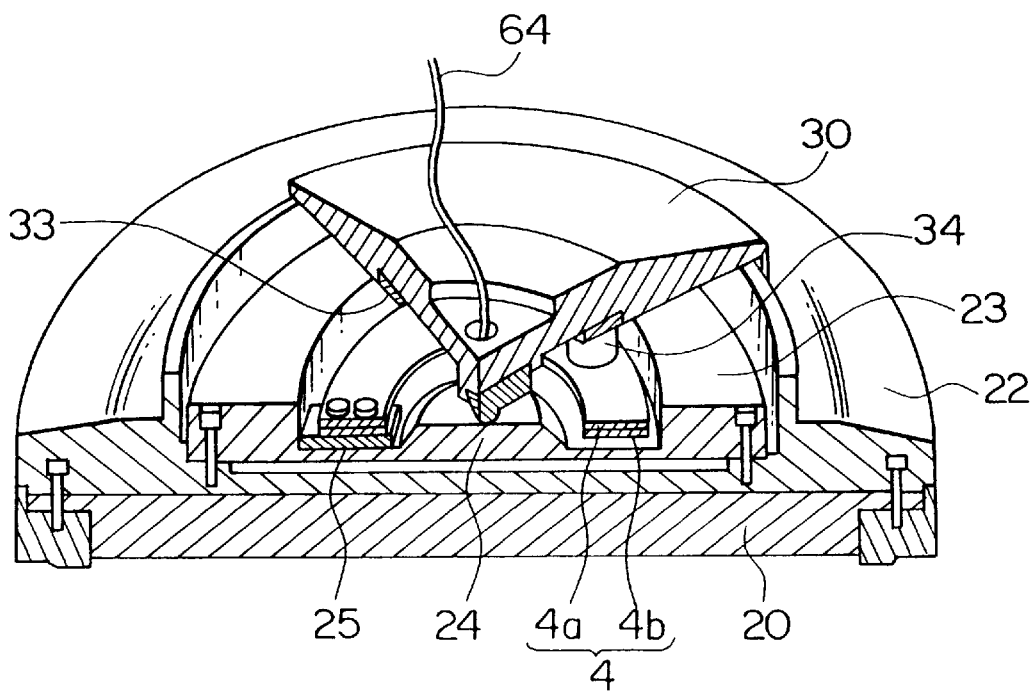
FIG. 3 is a perspective view showing the carrier in a partially broken-away manner.

The annular flat spring 4 comprises two annular flat spring members 4a, 4b which are disposed in the spring receiving chamber 2b defined in the housing 22. Specifically, as shown in FIGS. 2 and 3, a mounting member 23 having at its center a load-cell-abutting portion 24 of a tapered configuration is disposed on a bottom portion of the spring-receiving chamber 2b and bolted to the housing 22.

A support means is provided on the load-cell-abutting portion 24 of the mounting member 23 and it comprises three second support members 25 projectively provided on the periphery of the load-cell-abutting portion 24 at a circumferential interval of 120 degrees spaced from each other.

On the other hand, a base ring 33 is mounted on an inner peripheral surface of the flange 30 through a ring 32. On a lower surface of the base ring 33 there is provided another support means which comprises three first support members 34 projected from the lower surface of the base ring 33 at circumferentially equal intervals with respect to each other, i.e., at an angle of 120 degrees so as to be disposed between the second support members 25.

Specifically, the second support members 25 project from the periphery of the load-cell-abutting portion 24 toward the flange 30 whereas the first support members 34 project from the lower surface of the base ring 33 toward the mounting member 23.

The two flat spring members 4a, 4b of the annular flat spring 4 are laminated or stacked one over the other in intimate contact with each other and bolted to the support members 25, 34 in such a manner that the lower flat spring member 4b is disposed in abutment with an upper surface of each second support member 25 with the upper flat spring member 4a being disposed in abutment with a lower surface of each first support member 34.

Figure 4:
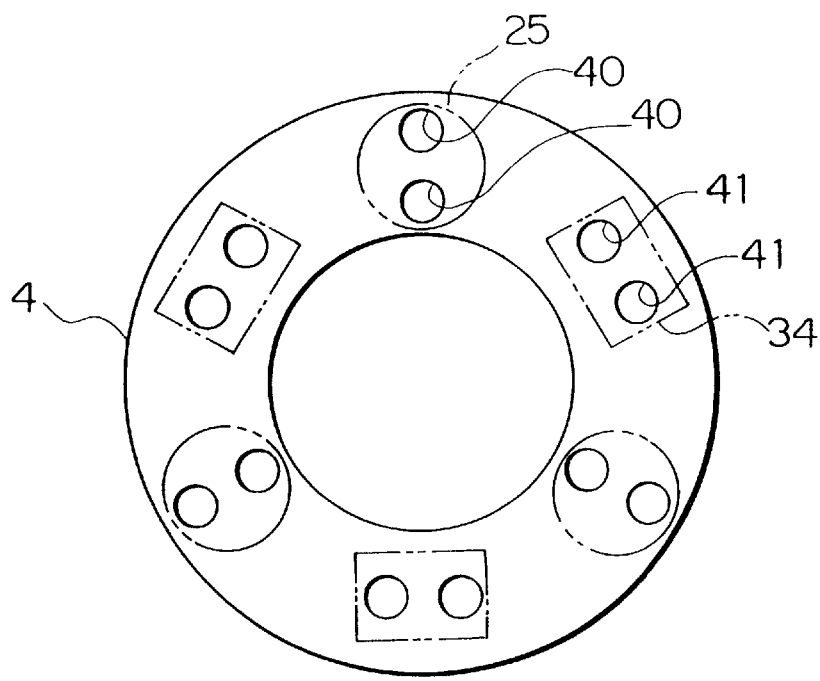
FIG. 4 is a plan view of an annular flat spring.

More specifically, as shown in FIG. 4, each of the annular flat spring members 4a, 4b has a plurality of first pairs of radially aligned holes 40, 40 and a plurality of second pairs of circumferentially aligned holes 41, 41 formed therethrough. The first paired holes 40, 40 are disposed at circumferentially equal intervals (e.g., at 120 degrees apart from each other), and the second paired holes 41, 41 are also disposed at circumferentially equal intervals (e.g., at 120 degrees apart from each other), with each of the first pairs being interposed between adjacent ones of the second pairs.

These first and second pairs of holes 40, 40; 41, 41 are positioned on the upper surfaces of the second support members 25 and the lower surfaces of the first support members 34, as indicated by alternate long and two short dashes lines in FIG. 4, so that in this state, bolts 42 are screwed into the threaded bores in the second support members 25 through the paired holes 40, 40 from above, and bolts 43 are screwed into the threaded bores in the first support members 34 through the paired holes 41, 41 from below.

In this manner, the two annular flat spring members 4a, 4b are disposed concentrically with the central axis L of the carrier 31 and supported by the second support members 25 at three points thereof from below and by the first support members 34 also at three points thereof from above, whereby they are properly assembled so as to be in parallel with the wafer 200.

The carrier 1 incorporating therein the two annular flat spring members 4a, 4b in the above manner is driven to rotate about its own axis of rotation by means of the motor 5, as clearly seen from FIG. 1.

Specifically, the frame member 51 is mounted on an upper portion of the carrier shaft 31 through a bearing 50 with the motor 5 being installed in and fixedly secured to the frame member 51.

The motor 5 is equipped with a drive gear wheel 52 attached to its rotation shaft, the drive gear wheel 52 being in meshing engagement with a driven gear wheel 53 attached to an upper end of the carrier shaft 31.

With this arrangement, the rotational force or torque of the motor 5 is transmitted to the carrier 1 through the drive and driven gear wheels 52, 53 so that the carrier 1 is thereby driven to rotate about the central axis L (FIG. 2) of the carrier shaft 31.

The frame member 51 is mounted on a pair of rails 54 through the intermediary of guide members 55 for vertical movements therealong.

The cylinder 300 is operatively coupled with the frame member 51. Specifically, the cylinder 300 has a piston rod 310 which is attached at its lower end to an upper surface of the frame member 51 such that, by changing the pressure of air in the cylinder 300, the piston rod 310 is driven to move in the vertical direction so as to raise or lower the frame member 51 together with the carrier 1, thus applying an urging force to the carrier 1 and hence to the wafer 200.

The controller 6 for controlling the pressure or urging force of the cylinder 300 comprises a pressure sensing means in the form of a load cell LS, an amplifier 60, a comparator 61 and a transducer 63.

The load cell LS is, for example, a compressive type pressure sensor for sensing an urging force applied thereto from the pressure-receiving member 3 of the carrier 1, the load cell LS being mounted on the pressure-receiving member 3 and interposed between the holder 2 and the pressure-receiving member 3.

More specifically, as illustrated in FIG. 2, the load cell LS is mounted on a support 36 provided at a central portion of the inner surface of the flange 30 of the pressure-receiving member 3, and it has a pressure sensing element LSH disposed in abutment against the center of an upper surface of the load-cell-abutting portion 24.

With this arrangement, when the pressure-receiving member 3 is subjected to a downwardly pushing force, the pressure sensing element LSH of the load cell LS receives the downwardly pushing or urging force applied thereto and generates a pressure detection signal VS indicative of the sensed pressure value.

A signal line or wiring 64 for transmitting the pressure detection signal VS extends from the load cell LS to an input terminal of the amplifier 60 by way of the support 36, an unillustrated aperture in the flange 30, a central bore 31a in the carrier shaft 31 and a slip ring 65, as clearly shown in FIGS. 1 and 2.

The amplifier 60 serves to amplify a voltage of the pressure detection signal VS and it has an output terminal connected to the comparator 61.

The comparator 61 compares the pressure detection signal VS from the amplifier 60 with a preset reference signal V0 from a reference signal generator 62, and generates a differential voltage ΔV therebetween to the transducer 63 as its output.

The reference signal generator 62 generates a preset reference signal V0 corresponding to a desired value of urging force to be applied to the pressure-receiving member 3 of the carrier 1 and outputs it to the comparator 61.

The transducer 63 serves to regulate the air pressure in the cylinder 300 based on the differential voltage ΔV from the comparator 61. Specifically, when the differential voltage ΔV is positive, the transducer 63 reduces the air pressure in the cylinder 300 by an amount corresponding to the differential voltage ΔV, whereas when the differential voltage ΔV is negative, it increases the air pressure in the cylinder 300 by an amount corresponding to the differential voltage ΔV.

The operation of the wafer pressurizing apparatus according to this embodiment will now be described below in detail.

First, referring to FIG. 1, in order to control a pressure applied to the load cell LS to the preset pressure value indicated by the preset reference signal V0 generated by the reference signal generator 62, the cylinder 300 is operated to pressurize the carrier 1 and the surface plate 210 is driven to rotate by an unillustrated drive means such as a motor while driving the carrier 1 to rotate about its axis of rotation by means of the motor 5.

Thus, the wafer 200 is caused to rotate on the surface plate 210 by means of the carrier 1 while being pushed against the surface of the surface plate 210, so that the surface of the wafer 200 contacting the surface plate 210 is thereby polished.

During the polishing operation, a vertical urging force is applied to the load cell LS. That is, in addition to the urging force of the cylinder 300, gravitational forces due to the weights of the frame member 51 and the pressure-receiving member 3 are also applied to the load cell LS as a vertical force and sensed thereby. Accordingly, as long as the load cell LS senses the vertical force, the sensed pressure value is substantially close to the actual polishing force or pressure applied to the wafer 200.

However, as described above, since the carrier 1 is rotating about its own axis of rotation on the rotating surface plate 210 and the holder 2 is formed separately from the pressure-receiving member 3, in addition to the vertical force V, a rotational force R due to a torsion or twist between the holder 2 and the pressure-receiving member 3 occurring during the self-rotation of the carrier 1 and a horizontal force H due to a displacement of the pressure-receiving member 3 resulting from the rotation of the surface plate 210 might be applied to the load cell LS.

Figure 6:
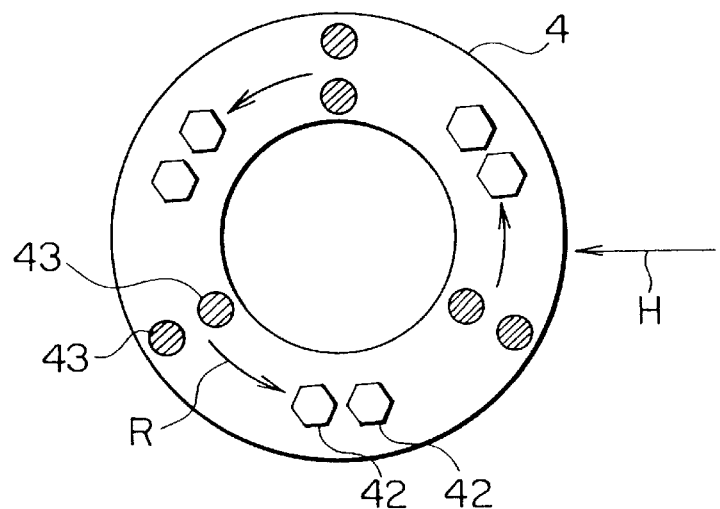
FIG. 6 is a plan view showing a condition in which the rotational force and the horizontal force are applied to the annular flat spring.

In this case, the two annular flat spring members 4a, 4b disposed concentrically with the central axis L of the carrier shaft 31 are coupled with the holder 2 and the pressure-receiving member 3 through the support members 25, 34 by means of bolts 42, 43, so that the rotational force R is applied to the annular flat spring members 4a, 4b in a circumferential direction thereof, and the horizontal force H is applied to them in a radial direction thereof, as shown in FIG. 6.

However, the arrangement of the annular flat spring members 4a, 4b being fixedly attached to the support members 25, 34 by means of the multitude of bolts 42, 43 serves to prevent shearing and hence resultant circumferential displacement of the annular flat spring members 4a, 4b.

Moreover, since each of the annular flat spring members 4a, 4b is thin and has a large modulus of section in the horizontal direction H and the distances between the paired bolts 42, 42; 43, 43 are limited, there will be no substantial radial deflection of the annular flat spring members 4a, 4b due to the horizontal force H. In this regard, even if the annular flat spring members 4a, 4b should be deflected to a more or less extent in the horizontal direction causing a resultant relative displacement between the holder 2 and the pressure-receiving member 3, such a displacement merely takes place with the pressure sensing element LSH of the load cell LS alone which is in contact with the load-cell abutting portion 24, thus giving rise to no substantial damage to the pressure sensing element LSH.

As a result, the annular flat spring members 4a, 4b will be subjected to no substantial deformation due to the rotational force R and/or the horizontal force H, so that there will be no relative torsion or twist between the holder 2 and the pressure-receiving member 3 and/or no displacement of the pressure-receiving member 3 relative to the holder 2.

Figure 7:
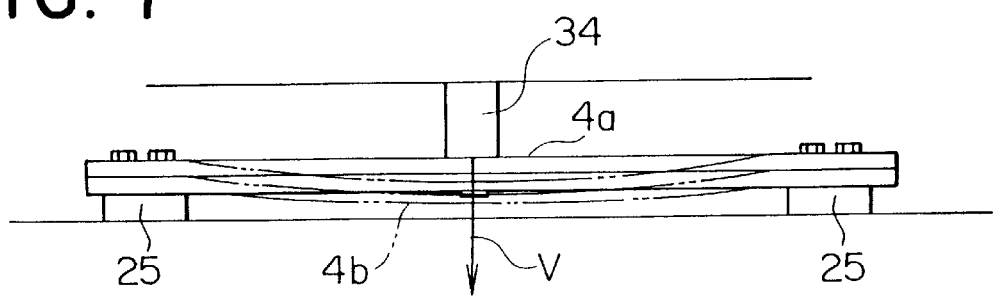
FIG. 7 is a schematic view showing a condition in which the vertical force is applied to the annular flat spring.

In contrast to this, the vertical force V is applied directly to the annular flat spring members 4a, 4b through the first support member 34, as shown in FIG. 7.

In this case, since the modulus of section in the vertical direction V of the annular flat spring members 4a, 4b is far smaller than that in the horizontal direction H thereof, the annular flat spring members 4a, 4b will be deflected in the downward direction, as indicated at the alternate long and two short dashes line in FIG. 7.

Figure 5:
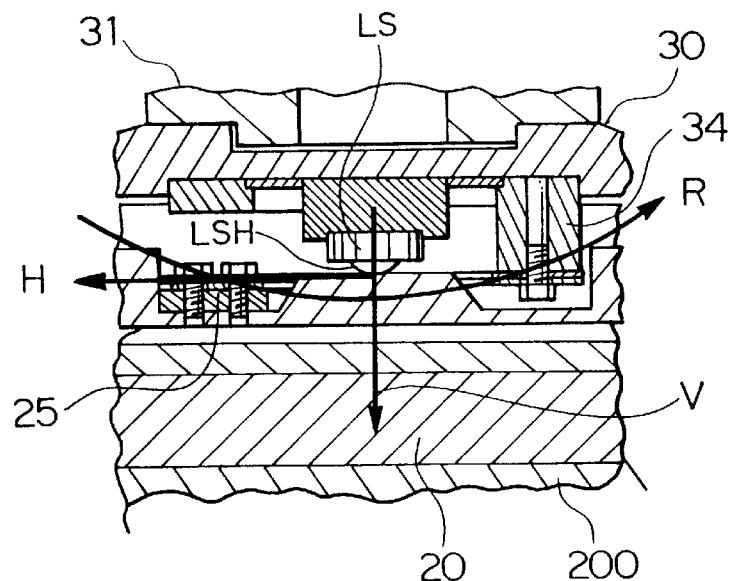
FIG. 5 is a cross sectional view showing a condition in which a vertical force, a rotational force and a horizontal force are applied to a load cell.

As a consequence, the load cell LS is subjected to the vertical force V alone without being influenced by the rotational force R and the horizontal force H, so that it can precisely sense a pressure substantially equal to the actual polishing force, as shown in FIG. 5.

In this manner, as illustrated in FIG. 1, the pressure value as sensed by the load cell LS is input to the amplifier 60 as a pressure detection signal VS by way of the signal line 64, where it is amplified and output to the comparator 61.

The comparator 61 compares the pressure detection signal VS with the preset reference signal V0 from the reference signal generator 62, and generates a differential voltage ΔV indicative of a difference in voltage between the pressure detection signal VS and the reference signal V0, which is then supplied to the transducer 63.

The transducer 63 increases or decreases the urging force of the cylinder 300 based on the differential voltage ΔV in order that the pressure detection signal V applied to the load cell LS is regulated to a desired pressure value.

In this manner, according to the wafer pressurizing apparatus of this embodiment, influences of the rotational force R and the horizontal force H to be applied to the load cell LS during the polishing operation of the wafer 200 can be excluded, whereby the load cell LS can sense the pressure detection signal V alone substantially equal to the actual polishing pressure applied to the wafer 200, thus enhancing detection accuracy of the load cell LS to a substantial extent. As a result, it becomes possible for the controller 6 to perform highly accurate pressure control, thereby substantially improving the precision in the polishing operation such as the polishing rate and the like.

Since the means for excluding the influences of the rotational force R and the horizontal force H is constructed of a simple arrangement that the resilient means comprises inexpensive annular flat spring members 4a, 4b supported by the support members 25, 34, the entire apparatus can be manufactured at low costs.

Moreover, the stacked or laminated construction of the two annular flat spring members 4a, 4b serves to increase the strength of the apparatus against the vertical force V, thus improving the durability thereof.

SECOND EMBODIMENT

Figure 8:
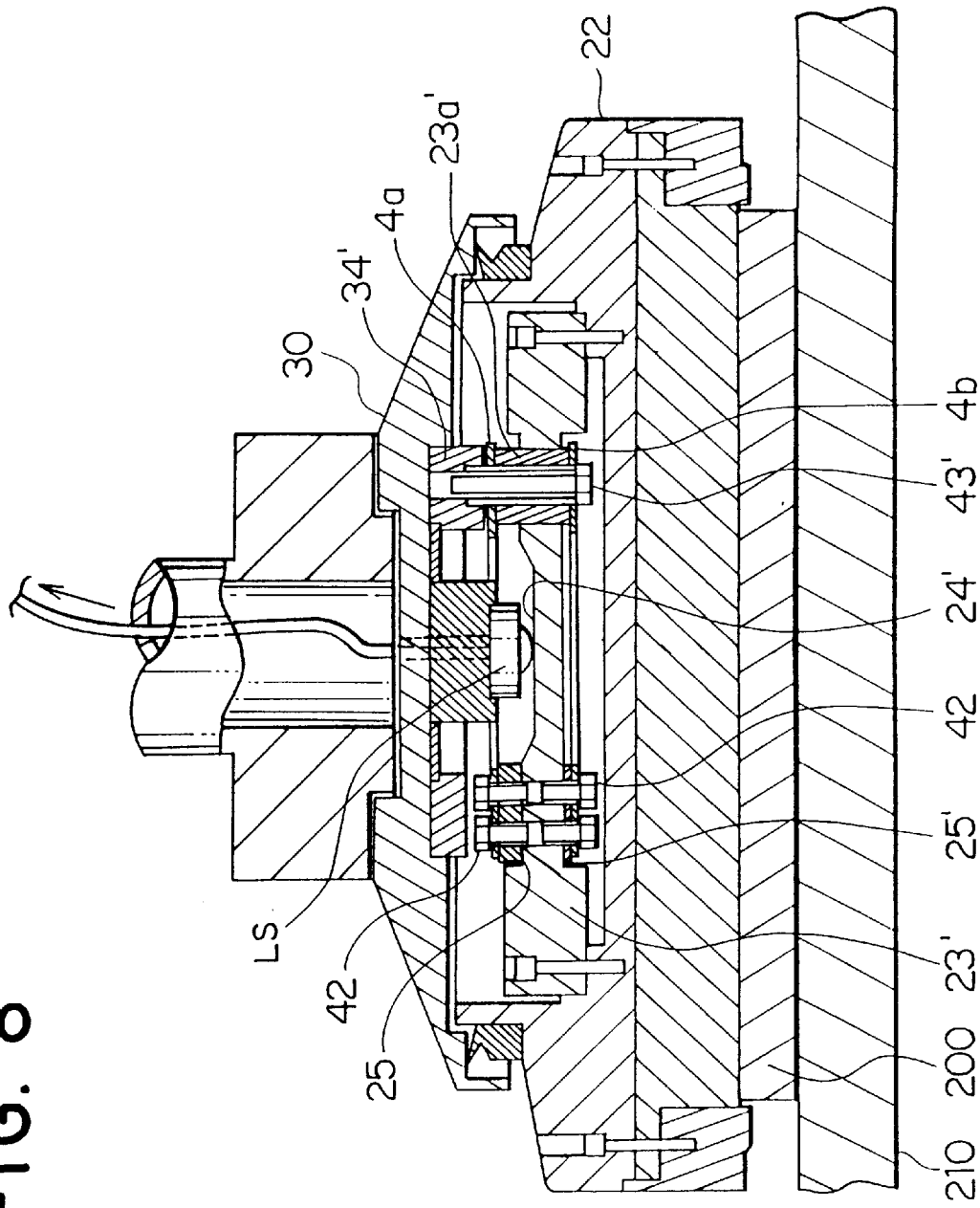
FIG. 8 is a cross sectional view showing essential portions of a wafer pressurizing apparatus in accordance with a second embodiment of the present invention.

FIG. 8 shows, in cross section, essential parts of a wafer pressurizing apparatus in accordance with a second embodiment of the present invention.

This embodiment is substantially similar to but only different from the above-mentioned first embodiment in that the two annular flat spring members 4a, 4b are not closely stacked in intimate contact with each other, but instead disposed in parallel at a predetermined space vertically apart from each other. Specifically, a mounting member 23' having a load-cell-abutting portion 24' recessed in a tapered configuration is attached to the housing 22. A plurality of (e.g., three in the illustrated embodiment) support portions 25, 25' are concavely formed or recessed on a first or upper surface and a second or lower surface, respectively, of the mounting member 23' at a predetermined circumferential interval, e.g., at an angle of 120 degrees apart from each other. The annular flat spring members 4a, 4b are placed in abutment with the support portions 25, 25' and fixedly attached to the mounting member 23' by means of bolts 42.

Figure 9:
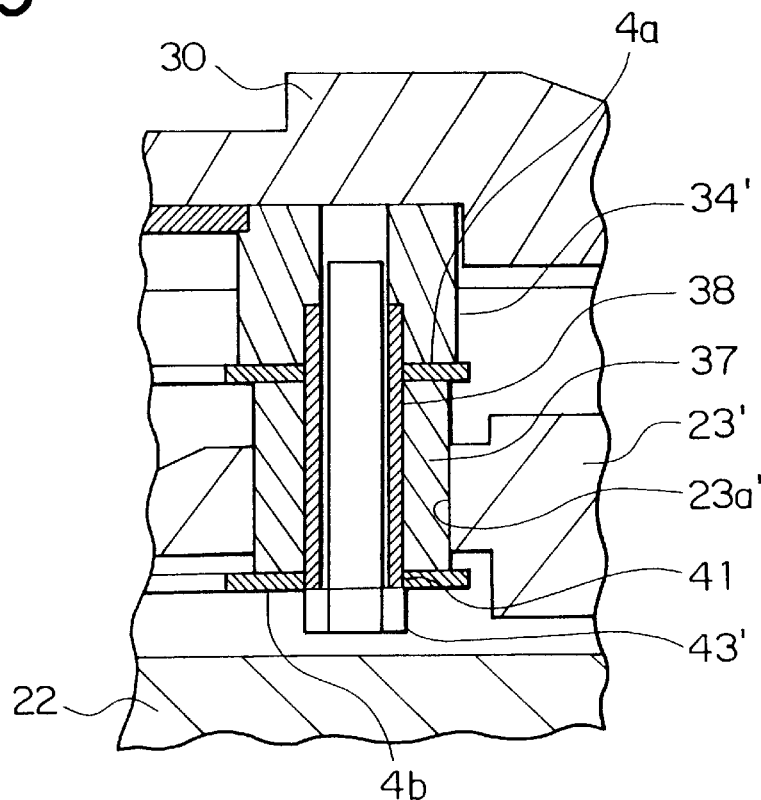
FIG. 9 is a cross sectional view showing a condition in which an annular flat spring of the second embodiment is mounted on support portions.

As shown in FIG. 9, the mounting member 23' has a plurality of holes 23a' formed therethrough and disposed at equal circumferential intervals, e.g., at an angle of 120 degrees apart from each other. A plurality of blocks 37 are inserted into the corresponding holes 23a' for vertical movement relative thereto. The annular flat spring members 4a, 4b are placed in abutment with the opposite end surfaces, respectively, of each block 37 with a sleeve 38 being inserted through an aperture 41 in each of the spring members 4a, 4b and through an axial bore in each block 37. A headed bolt 43' is inserted into each sleeve 38 from below and screwed into a threaded hole in each support member 34', whereby the two annular flat spring members 4a, 4b disposed in a vertically spaced and parallel relation with respect to each other are firmly attached to the flange 30 of the pressure-receiving member 3 in such a manner that they can be deflected downwardly upon receipt of the vertical force V through the support elements 34' and the blocks 37.

Figure 10A:
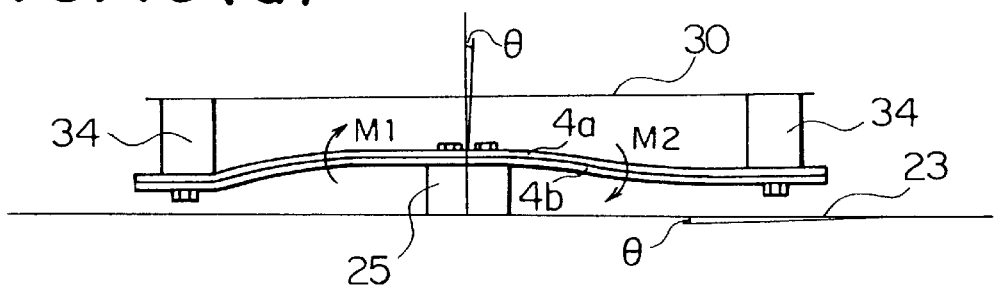
Figure 10B:
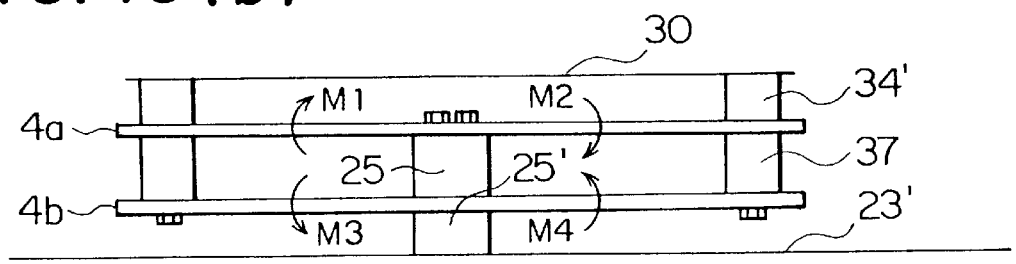

With the above arrangement, a pressure or urging force due to the vertical force V is applied to the wafer 200 in a uniform manner. That is, during the polishing operation, the wafer 200 rotating relative to the surface plate 210 is sometimes caused to peck or incline in the revolving direction of the wafer 200 due to frictional forces created between itself and the contacting surface of the surface plate 210, so that the holder 2 of the carrier 1 is about to be made into an inclined state. For example, as shown in FIG. 10(a), with the two annular flat spring members 4a, 4b closely stacked or laminated as in the first-mentioned embodiment, if the mounting member 23 is caused to incline at an angle of θ to accordingly tilt the support member 25, there develops an upward bending moment M1 acting in an upward direction on those portions of the annular flat spring members 4a, 4b which lie on the left-hand side of the second support member 25, and a downward bending moment M2 acting in a downward direction on the right-hand portion of the annular flat spring members 4a, 4b with respect to the second support member 25, whereby the annular flat spring members 4a, 4b as a whole are twisted, as illustrated in FIG. 10(a).

As a consequence, the holder 2 together with the wafer 200 are also inclined at the same angle of θ, so that the pressure or urging force applied by the holder 2 to the wafer 200 becomes greater on the downwardly inclined portion of the holder 2 than on the remaining or upwardly inclined portion thereof, rendering the distribution of pressure or urging force over the surface of the wafer 200 non-uniform with the result that the wafer 200 has not been polished uniformly. Thus, a uniform polishing rate over the entire surface of the wafer 200 can not be maintained.

In contrast to this, according to the second embodiment, when the wafer 200 is about to be pecked or inclined to thereby tilt the mounting member 23', there takes place opposing bending moments M3, M4 on the lower annular flat spring member 4b which offsets the bending moments M1, M2 created on the upper annular flat spring member 4a, thus preventing torsion or twist of the overall annular flat spring members 4a, 4b. Accordingly, the inclination of the annular flat spring members 4a, 4b is suppressed to a substantially limited value, and hence can be ignored.

For this reason, the wafer 200 remains substantially in parallel with the holder 2 and the surface plate 210, resulting in a uniform distribution of the pressure or urging force applied to the wafer 200. Consequently, the polishing rate becomes uniform over the entire surface of the wafer 200, resulting in improvements in uniformity of surface polishing of wafers amongst a plurality of batches or lots thereof.

The construction and operation of this embodiment other than the above are similar to those of the first-mentioned embodiment, and hence a detailed description thereof is omitted here.

THIRD EMBODIMENT

Figure 11:
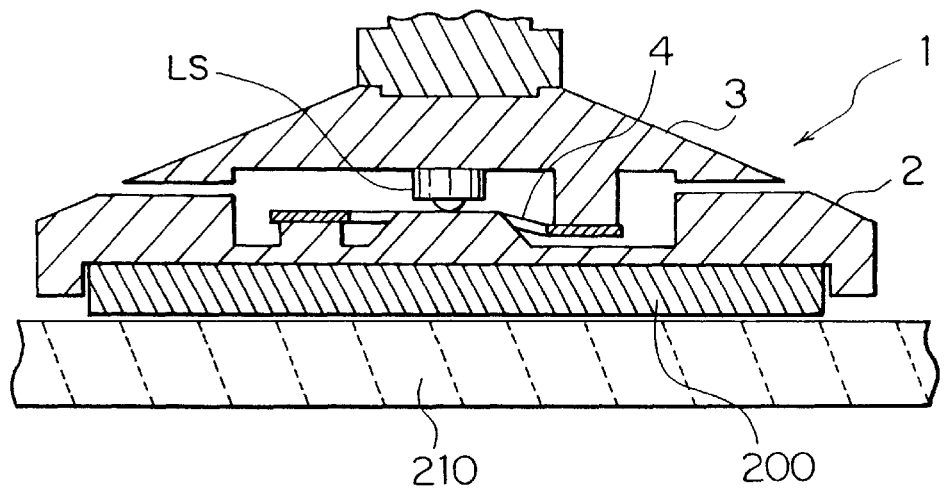
FIG. 11 is a schematic cross-sectional view of essential portions of a wafer pressurizing apparatus in accordance with a third embodiment of the present invention.

FIG. 11 schematically illustrates, in cross section, essential portions of a wafer pressurizing apparatus in accordance with a third embodiment of the present invention.

This embodiment is substantially similar but different from the previous embodiments in that a compressive type load cell LS is employed which acts as a tensile type sensor as well as a compressive type sensor.

Specifically, as shown in FIG. 11, the pressure-receiving member 3 of the carrier 1 is preloaded so as to make the annular flat spring members 4a, 4b to deflect, and in this state, a pressure or urging force applied to the pressure-receiving member 3 is set to "zero".

In this state, as the pressure-receiving member 3 is pulled upwardly, the annular flat spring members 4a, 4b are restoring to their original or non-deflected state, thus decreasing the pressure or urging force applied to the pressure-receiving member 3.

Figure 12:
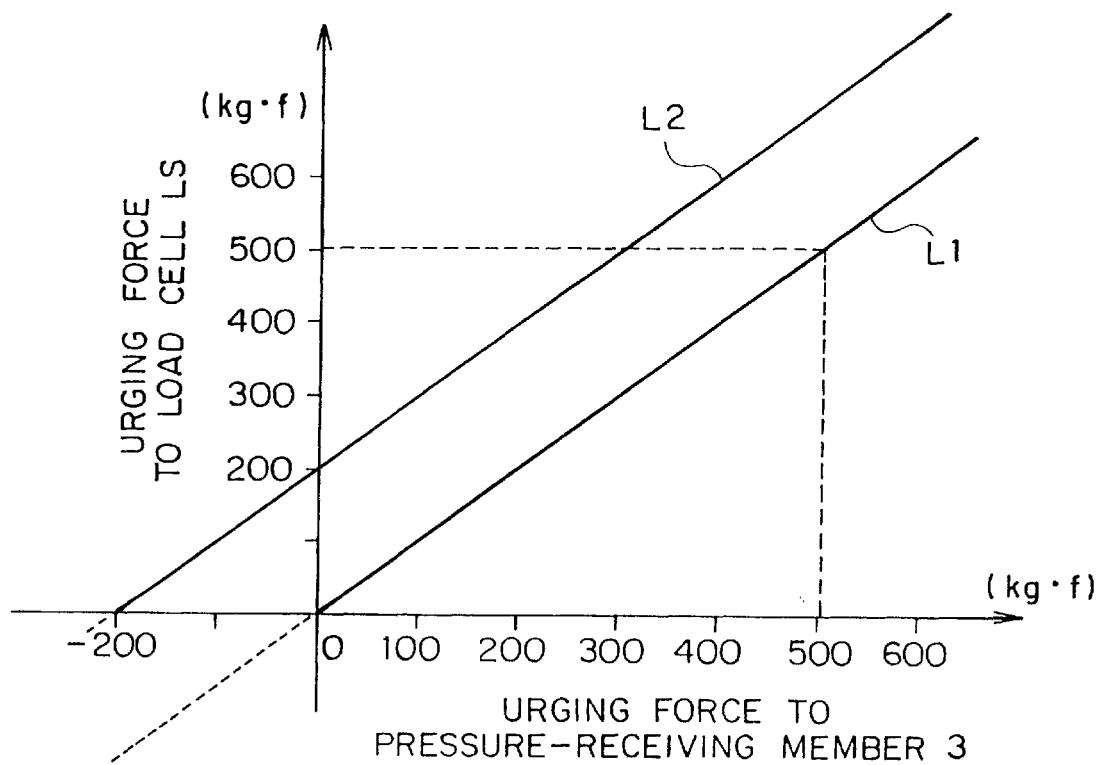
FIG. 12 is a diagrammatic view showing a relationship between an urging force applied to a load cell and an urging force applied to a pressure-receiving member.

For example, with the first- and second-mentioned embodiments in which the carrier 1 is subjected to no preload, there exists a relationship between the urging forces to the load cell LS and the pressure-receiving member 3, as designated by straight line L1 in FIG. 12, but when an appropriate amount of preload (e.g., 200 Kg·f) is applied to the load cell LS with the urging force to the pressure-receiving member 3 being set to "0" Kg·f, the pressure-receiving member 3 is pulled upwardly to restore the annular flat spring members 4a, 4b to their horizontal state, whereupon the urging force or tensile force applied to the pressure-receiving member 3 becomes equal to −200 Kg·f, for example, so that the load cell LS can sense the gravity or weight of the holder 2 as being 200 Kg·f.

Consequently, in consideration of the urging force of the predetermined value (e.g., 200 Kg·f) applied by the pressure-receiving member 2 to the wafer 200, by setting the urging force applied to the wafer 200 to 0 Kg·f under the condition of the load cell LS being subjected to a preload of the same value (e.g., 200 Kg·f) as the urging force, it is possible to precisely sense the actual polishing force or pressure applied to the wafer 200.

The construction and operation of this embodiment other than the above are substantially similar to those of the first- or second-mentioned embodiments, and hence it will be unnecessary to describe them in detail.

Many features and advantages of the present invention are apparent from the foregoing description and thus it is intended by the appended claims to cover all such features and advantages of the apparatus which fall within the true sprit and scope of the invention. Further, since various changes and modifications will readily occur to the skilled in the art, it is not intended to limit the invention to the exact construction and operation illustrated and described herein.

By way of example, although in the foregoing description, the wafer pressurizing apparatus is applied to a CMP apparatus, it will readily be appreciated that the present invention is also of course applicable to a polishing apparatus such as, for example, a single-surface polishing apparatus for polishing a one-side surface of a bare wafer or the like.

Further, though in the first-mentioned embodiment, the two annular flat spring members 4a, 4b are stacked or laminated one over the other, a single annular flat spring member or three or more flat spring members can similarly be employed substantially with the same results.

Moreover, although in the second-mentioned embodiment, the two annular flat spring members 4a, 4b are disposed in parallel at a predetermined space or distance apart from each other, the spring means may comprise a first group of flat spring members stacked or laminated one over another and a second group of flat spring members, which preferably correspond in number to the first group of flat spring members and are similarly stacked or laminated one over another, with a predetermined space formed therebetween.

Also, although in the foregoing description, the annular flat spring members 4a, 4b are of the circular peripheral configuration, it should be construed that they are not limited to this configuration but may take other annular configurations such as a triangle, square, rectangle, polygon, etc.

Furthermore, although the pressure sensing means comprises the load cell LS, it may instead be a pressure converter such as a strain gauge converter.

Further, although the load cell LS is mounted on the pressure-receiving member 3, it may instead be mounted on the holder 2.

Still further, although in the above embodiments, it is contemplated that a wafer 200 is polished directly by the surface plate 210, the wafer may be polished by a surface plate having a pad attached to a top surface thereof while using a wafer pressurizing apparatus as described above of the present invention. In this case, however, the wafer pressurizing apparatus according to the third embodiment is particularly preferred because there is a relatively large frictional force between the wafer and the pad which would tend to cause the wafer to peck or tilt.

What is claimed is:

1. An apparatus configured to control a force applied to a wafer during wafer polishing, said apparatus comprising:
    a carrier configured to rotate about an axis, said carrier having a wafer holder, a pressure-receiving member, and at least one resilient member interposed therebetween;
    a pressure sensor configured to generate an output signal corresponding to a sensed pressure;
    a controller configured to receive a signal from said pressure sensor and generate a corresponding output signal; and
    a pressure source configured to receive an output signal from said controller and apply a corresponding force to said pressure-receiving member.

2. The apparatus according to claim 1, wherein said pressure source includes an air pressure cylinder.

3. The apparatus according to claim 1, wherein said controller includes an amplifier to amplify a signal received from said pressure sensor, a comparitor to compare said amplified signal to a reference signal, and a transducer configured to regulate the force applied to said pressure-receiving member.

4. The apparatus according to claim 1, further comprising a support portion configured to support a plurality of said resilient members at a pre-determined distance from each other.

5. The apparatus according to claim 1, wherein said pressure sensor is configured to detect both tensile and compressive force.

6. The apparatus according to claim 1, wherein said at least one resilient member is pre-loaded to deform in a direction away from said pressure-receiving member.

7. A wafer carrier configured to rotate about an axis comprising:
    a holder including a first support portion;
    a pressure-receiving member having a second support portion, said member operatively coupled to said holder; and,
    a flat spring interposed between said holder and said pressure receiving member.

8. The wafer carrier according to claim 7, wherein said flat spring includes a plurality of flat spring members.

9. The wafer carrier according to claim 8, wherein said plurality of flat spring members are laminated together.

10. The wafer carrier according to claim 8, further comprising support members, wherein said support members are configured to support said flat spring members apart from adjacent flat spring members.

11. The wafer carrier according to claim 7, wherein said flat spring member is deformed by a pre-determined amount.

12. The wafer carrier according to claim 7, further comprising a pressure sensor interposed between said holder and said pressure-receiving member.

13. An apparatus for applying an urging force to a wafer, said apparatus comprising:
   a carrier for holding a wafer and adapted to rotate about an axis of rotation;
   a pressure-applying means for urging said wafer held by said carrier against a surface plate;
   a pressure sensing means for sensing an urging force and generating a corresponding output signal; and
   a controller for controlling the urging force of said pressure-applying means based on the output signal from said pressure sensing means;
   wherein said carrier comprises:
      a holder for holding said wafer;
      a pressure receiving member disposed in confrontation with said holder for receiving the urging force of said pressure-applying means; and
      resilient means disposed between said pressure-receiving member and said holder so as to be deformable in a direction parallel to said axis, and
      wherein said pressure sensing means is disposed between said pressure-receiving member and said holder.

14. The apparatus according to claim 13, wherein said pressure-receiving member has a first support portion projecting toward said holder; and said holder has a second support portion projecting toward said pressure-receiving member; and said resilient means comprises a flat spring supported by said first and second support portions.

15. The apparatus according to claim 14, wherein said flat spring comprises a plurality of flat spring members laminated one over another, and wherein said flat spring members are supported by said first and second support portions.

16. The apparatus according to claim 14, wherein said flat spring comprises a plurality of flat spring members supported by said first and second support portions, and wherein said members are disposed in parallel with respect to each other at a predetermined distance.

17. The apparatus according to claim 13, wherein said resilient means is mounted between said pressure-receiving member and said holder in such a manner that it is deformed by a predetermined amount.

* * * * *